United States Patent [19]

Baliga et al.

[11] Patent Number: 4,823,176

[45] Date of Patent: Apr. 18, 1989

[54] VERTICAL DOUBLE DIFFUSED METAL OXIDE SEMICONDUCTOR (VDMOS) DEVICE INCLUDING HIGH VOLTAGE JUNCTION EXHIBITING INCREASED SAFE OPERATING AREA

[75] Inventors: Bantval J. Baliga; Tat-Sing P. Chow, both of Schenectady; Hsueh-Rong Chang, Scotia, all of N.Y.

[73] Assignee: General Electric Company, Schenectady, N.Y.

[21] Appl. No.: 33,952

[22] Filed: Apr. 3, 1987

[51] Int. Cl.[4] .................... H01L 29/78; H01L 29/44
[52] U.S. Cl. .................................. 357/23.4; 357/23.8; 357/20; 357/13
[58] Field of Search ............... 357/23.4, 20, 23.8, 357/13

[56] References Cited

U.S. PATENT DOCUMENTS 4,561,003 12/1985 Tihanyi et al. ................... 357/23.4
4,642,674 2/1987 Schoofs ............................. 357/23.4

FOREIGN PATENT DOCUMENTS 0160183 11/1985 European Pat. Off. ........... 357/23.8
55-78574(A) 6/1980 Japan ................................. 29/78
59-149058 8/1984 Japan ................................. 357/20

Primary Examiner—Andrew J. James
Assistant Examiner—Jerome Jackson, Jr.
Attorney, Agent, or Firm—Robert Ochis; James C. Davis, Jr.; Marvin Snyder

[57] ABSTRACT

A power field effect device has a high voltage blocking junction which intersects the device surface under the gate electrode. That intersection is a closed plane geometric figure whose center is within the body region of the device rather than in the more heavily doped base region of the device. The figure preferably is everywhere convex and has a maximum width of substantially less than the depletion width, at breakdown, of a corresponding parallel plane junction. The device breakdown voltage is higher than the breakdown voltage of a corresponding junction having a cylindrical edge with a straight axis. In a preferred embodiment, the high voltage blocking junction has a plurality of such intersections with the device surface, each situated beneath a segment of the gate electrode. In a bipolar embodiment, the gate electrode may be omitted.

32 Claims, 8 Drawing Sheets (VIEW INVERTED RELATIVE TO FIGURES 5 & 6)

(VIEW INVERTED RELATIVE TO FIGURES 9 & 10)

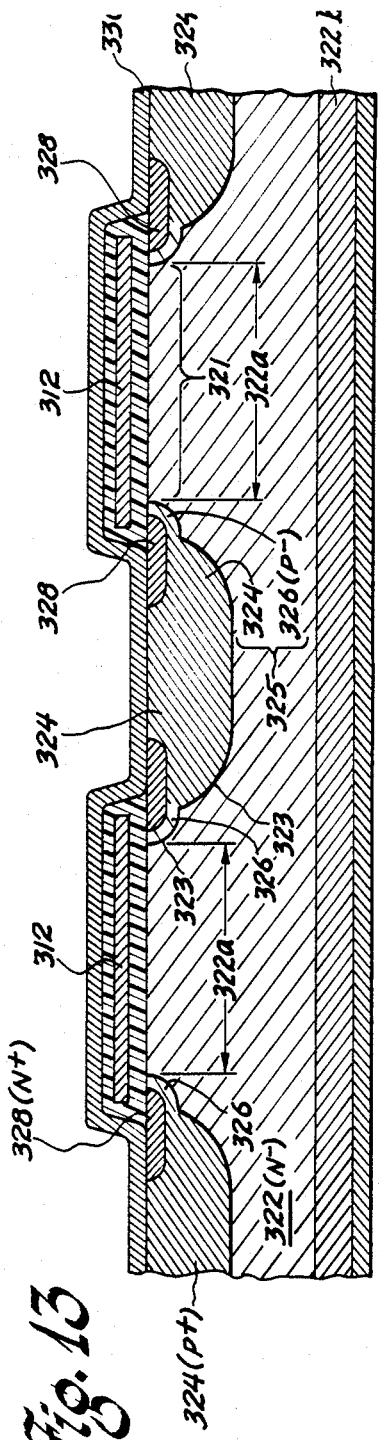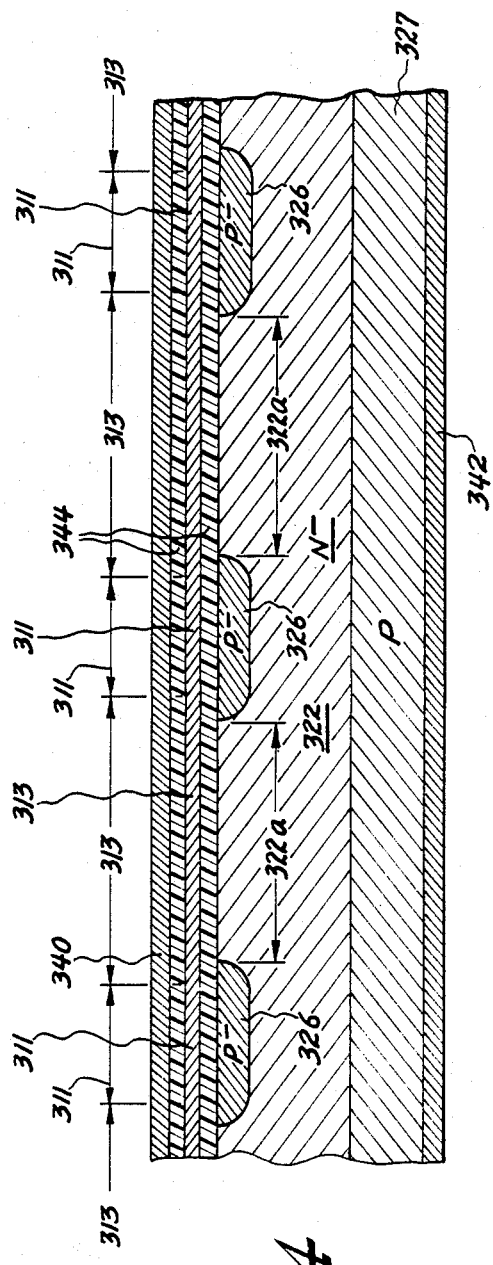
Fig. 13
Fig. 14

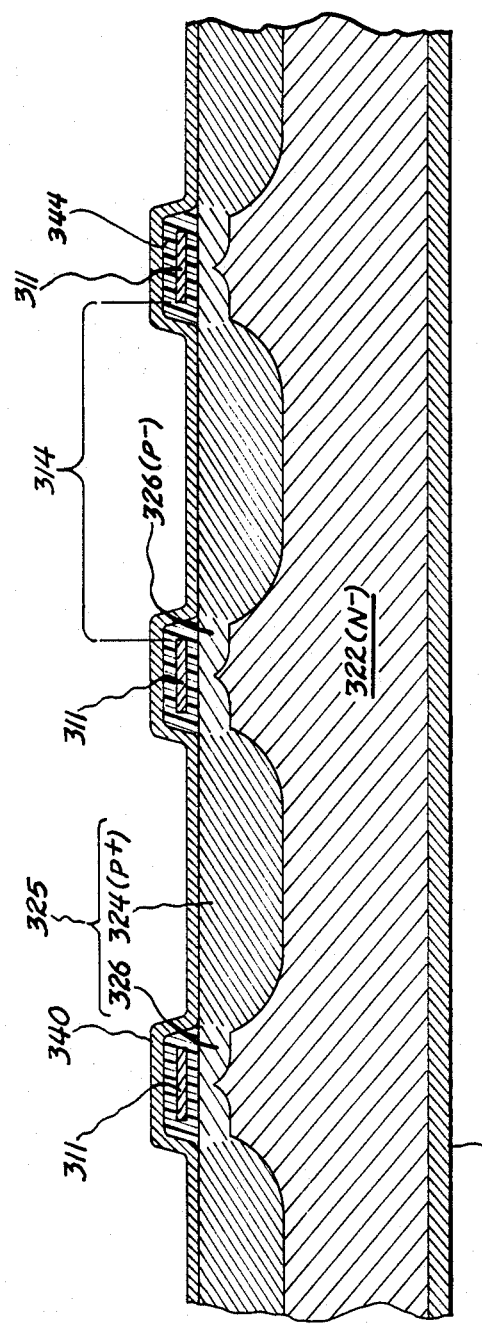

VERTICAL DOUBLE DIFFUSED METAL OXIDE SEMICONDUCTOR (VDMOS) DEVICE INCLUDING HIGH VOLTAGE JUNCTION EXHIBITING INCREASED SAFE OPERATING AREA

REFERENCE TO A RELATED APPLICATION

A related patent application entitled "Vertical Doubled Diffused Metal Oxide Semiconductor (VDMOS) Device With Increased Safe Operating Area and Method" by the present inventors, H. R. Chang, B. J. Baliga and T. P. Chow, Ser. No. 033,940 filed on even date herewith, is assigned to the same assignee and is incorporated herein by reference.

FIELD OF THE INVENTION

The present invention relates to the field of semiconductor field effect devices and more particularly, to such devices having increased safe operating areas.

BACKGROUND OF THE INVENTION

When field effect devices such as insulated gate bipolar transistors (IGBTs) must turn off a high current with an inductive load, the device must support the high voltage induced by stopping the current in the inductive load while high charge concentrations are still present within the device because of the high current which was flowing while the device was on. The problem also exists for metal-oxide-semiconductor field effect transistors (MOSFETs), but is less severe because MOSFETs are majority carrier devices. The concurrent limits on safe values of current and voltage define a device operating region known as the safe operating area (SOA) of such a device. That is, as long as the current and voltage are both within the safe operating area, the device will not be damaged and will be successful in turning off an inductive load. If the current/voltage to which the device is subject exceeds the safe operating area, then the device often fails. The SOA of a device is expressed in terms of a maximum load current and an applied voltage. However, that specified load current is actually determined by the active area of the device and the maximum charge density which its semiconductor structure can support at the specified applied voltage without undergoing device breakdown. The current density which creates this charge is normally expressed in amperes per square centimeter ($A/cm^2$).

It is known to increase the safe operating area of a device by increasing its physical area to reduce the current density to which the semiconductor material is subject at a given load current. However, this has the undesirable effect of decreasing processing yield and the maximum number of devices possible per processed wafer, both of which increase device cost. It is also known to increase the resistivity of the drift region of the device to increase the voltage at which the device breaks down. This has the undesirable effect of increasing the on-resistance of the device and its forward voltage drop when the device is on.

A known type of metal-oxide-semiconductor (MOS) power device having a main current path which includes a portion which is vertical through the thin dimension of the semiconductor includes a gate electrode grid having a rectangular array of rectangular windows therein through which the device active regions are double diffused. Minority carrier bypass sites are included in these windows as well as emitter regions. These minority carrier bypass sites and emitter regions are introduced by extending the high concentration base diffusion to the edge of the window to produce the bypass sites and spacing it from the edge of the window at the emitter sites. We have found that this configuration limits the safe operating area.

Accordingly, an object of this invention is to provide a technique which increases the safe operating area of a semiconductor field effect power device without requiring an increase in the device area or the resistance of its drift region.

Another object is to increase the safe operating area of a semiconductor field effect power device while retaining high gate grid conductivity.

SUMMARY OF THE INVENTION

The present invention achieves an increase in the safe operating area of a semiconductor field effect device by modifying the shape of its base region so that the high voltage blocking PN junction formed between the base region and the more lightly doped body region intersects the semiconductor surface and encloses an area of the body region at that surface which is a closed plane geometrical figure which is everywhere convex or whose maximum width is less than about the depletion width of the high voltage junction in the body region at breakdown. To maximize the breakdown voltage, the maximum radius of curvature of the boundary of the geometric figure is made small and is preferably substantially less than the depletion width of a corresponding parallel plane PN junction at its breakdown voltage. The geometric figure is preferably a circle.

This structure may be made by diffusing the base region under active gate segments each of which is either isolated from the remainder of the active gate segments or connected thereto by bridges of gate material which are narrow enough that the base diffusions merge underneath the bridges to provide the isolated plane geometric figure configuration of the body region at the device surface.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawing in which:

FIGS. 13, 14 and 15 are cross-sections through the device of FIG. 12 taken along the lines 13—13, 14—14 and 15—15, respectively.

DETAILED DESCRIPTION

Figure 1:
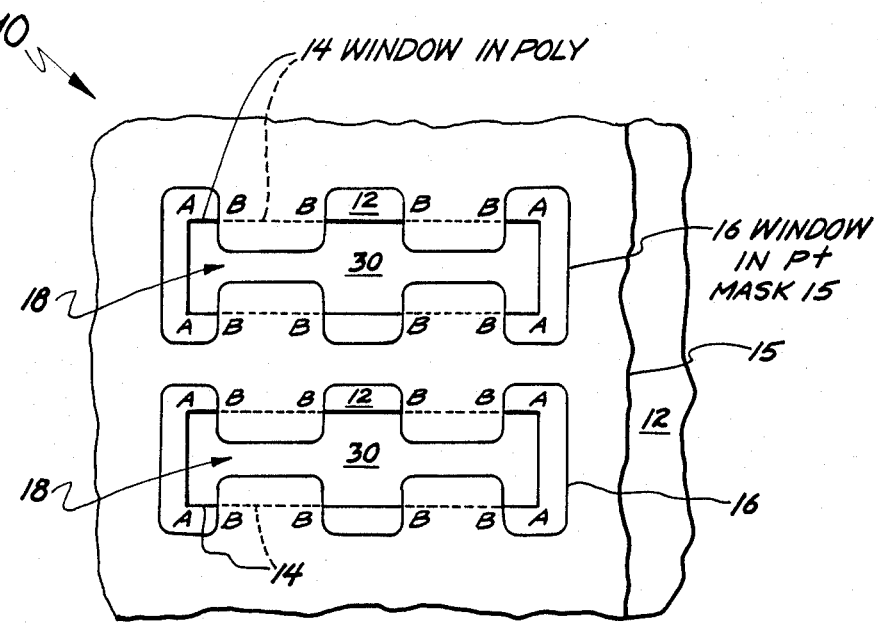
FIG. 1 is a plan view showing windows in the polysilicon gate in a prior art vertical current MOSFET or IGBT with the high concentration base diffusion mask overlaid on the window.

In FIG. 1 in plan view, a portion of a power field effect device 10 is illustrated during the process of fabrication. A polysilicon gate layer 12 is disposed on an insulating layer 44 (shown in FIGS. 5 and 6) over the surface 30 of a semiconductor wafer which is lightly doped with N type impurities and is thus of N− conductivity. Rectangular openings or windows 14 are created in the polysilicon layer 12 and the insulating layers 44 to form the gate electrode grid of the final device and to expose the surface 30 of the semiconductor material in order to diffuse device active regions therethrough into the underlying N− material. A mask 15 having windows 16 therein is overlaid on the polysilicon layer 12 with the windows 16 in the mask aligned with the windows 14 in the polysilicon gate in order to define the desired locations 18 for a P+ (high concentration) base diffusion. The locations 18 are that part of the surface 30 which are within a window 14 and a window 16.

Figure 2:
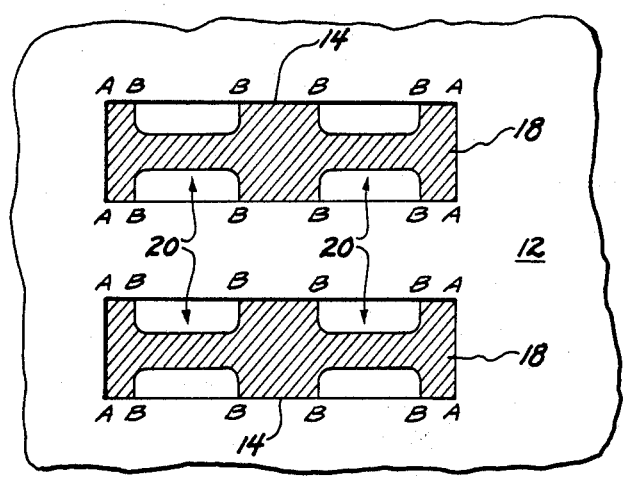
FIG. 2 is a plan view showing the area in the device of FIG. 1 in which the high concentration base dopant is deposited prior to diffusion.

In FIG. 2, the gate electrode layer 12 and the windows 14 therein are again shown with the areas 18 in which the P+ base dopant is disposed shaded for clarity. It should be noted, for reasons to be discussed subsequently, that each of the P+ dopant locations 18 has four right angle corners (A) at the corners of its window 14 and eight right angle corners at points B where, as shown in FIG. 1, its window 16 in the P+ mask 15 extends to the edge of its window 14. During diffusion of the high concentration of P type dopant which forms the P+ region, oxide grows in the regions 18. After completion of the P+ diffusion, the P+ masking material in areas 20, shown in FIG. 2, is removed without removing the oxide over the regions 18. P− (low concentration P type) regions are then diffused through areas 20 with the polysilicon 12 and the oxide over the P+ regions (area 18) serving as a diffusion mask. During this diffusion, the P− regions merge with the P+ region to create a single base region under each window 14. Following diffusion of the P− regions, an N+ source or emitter region is diffused through the same openings 20. The oxide over regions 18 is then removed.

Figure 3:
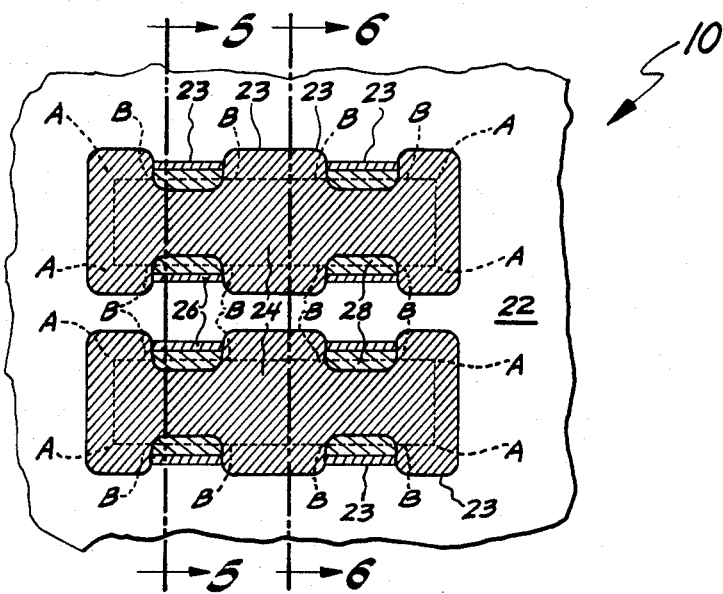
FIG. 3 is a plan view illustration of the shape of the diffused regions in the completed prior art device of FIG. 1.
Figure 4:
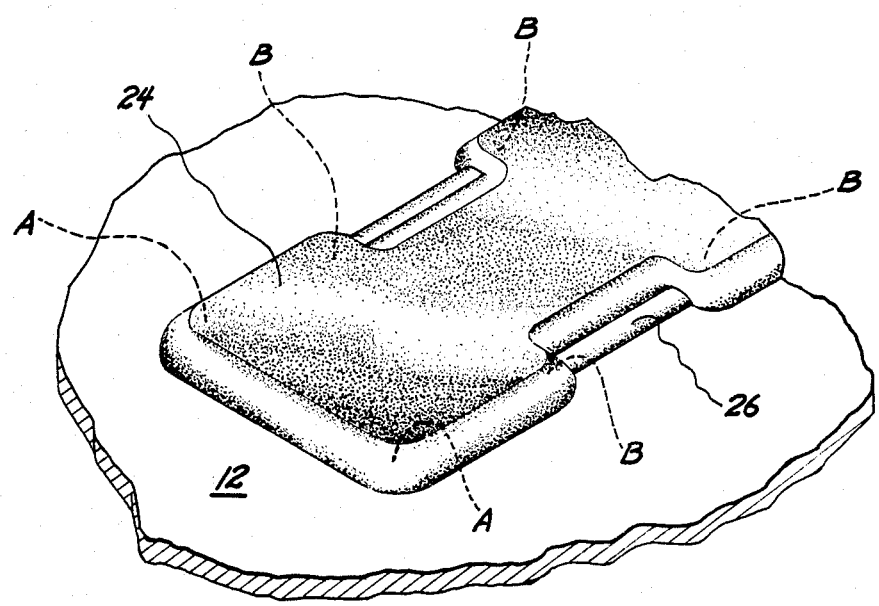
FIG. 4 is an inverted perspective view of the lower surface of one of the regions which forms the high voltage blocking junction in the prior art device of FIGS. 1-3.

FIG. 3 shows, in plan view, the location at the semiconductor surface of the final diffused regions of the device in relation to the edges of the windows 14 which are shown dotted in FIG. 3. FIG. 4 is a perspective view of the device inverted from its position in FIG. 3 showing only the insulated gate electrode 12 and the P type diffused regions 24 and 26. In the vicinity of each of the points A and B, the diffused junction has a generally spherical contour ($\frac{1}{8}$ of a sphere centered at the associated corner A or B) because that portion of the diffused region was formed by outward/downward diffusion (FIG. 3 view or upward/outward diffusion in the FIG. 4 view) from the associated corner A or B. Between two adjacent spherical portions of the junction, the junction is cylindrical because that portion of the junction was formed by outward/downward diffusion (FIG. 3 view or upward/outward diffusion in the FIG. 4 view) form a straight line edge of the dopant source area 18. Throughout this specification, the term "cylindrical junction" is used in the common meaning of the word "cylinder", that is, a cylinder having a circular cross section rather than in accordance with its much broader mathematical definition of which many people are unaware. The meaning given the term "cylindrical junction" herein is in accordance with common usage in the semiconductor industry. In the FIG. 3 view, the P+ diffused regions 24 extend outward beyond the edges of the windows 14 everywhere where the P+ dopant introduction pattern 18 extends to the edge of the window 14. The P− diffused regions 26 extend a lesser distance outward because they were introduced later and driven in for a shorter time. The N+ diffused regions 28 in turn extend outward under the polysilicon a lesser distance from the windows 14 than the P− regions 26 for the same reason. The high voltage blocking junctions 23 of FET device 10 follow, in FIG. 3, the outer edges of the P+/P− base diffused region and in FIG. 4 the surface of the P type region comprised of diffused regions 24 and 26. That is, in FIG. 3, junction 23 runs from the upper lefthand corner A along the top of the diffused region to the upper righthand corner A, thence down to the lower righthand corner A and back along the bottom of the diffused region to the lower lefthand corner A and up to the starting corner. Thus, the PN junction 23 has a complex shape which is very undulatory and exhibits a spherical contour centered at each of the corners A and B of the diffusion as seen more clearly in FIG. 4. The intersection of the blocking junction 23 with the semiconductor surface forms a closed geometric figure whose center is within the base region.

Figure 5:
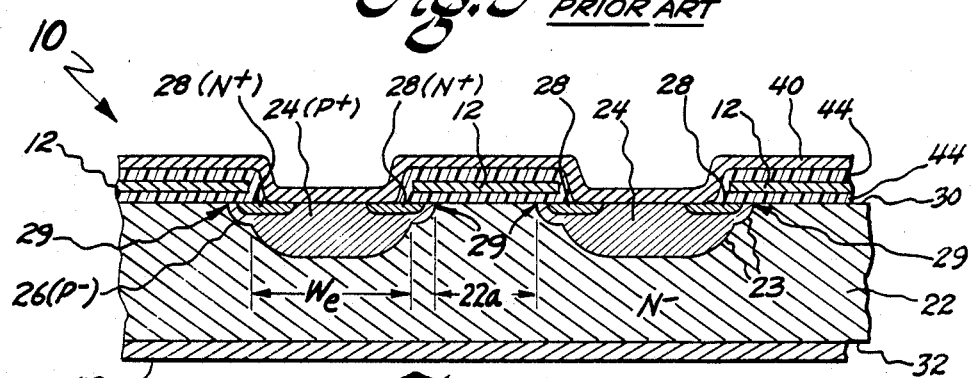
FIGS. 5 and 6 are cross-sections through the prior art device of FIG. 3 taken along the lines 5—5 and 6—6 in FIG. 3.
Figure 6:
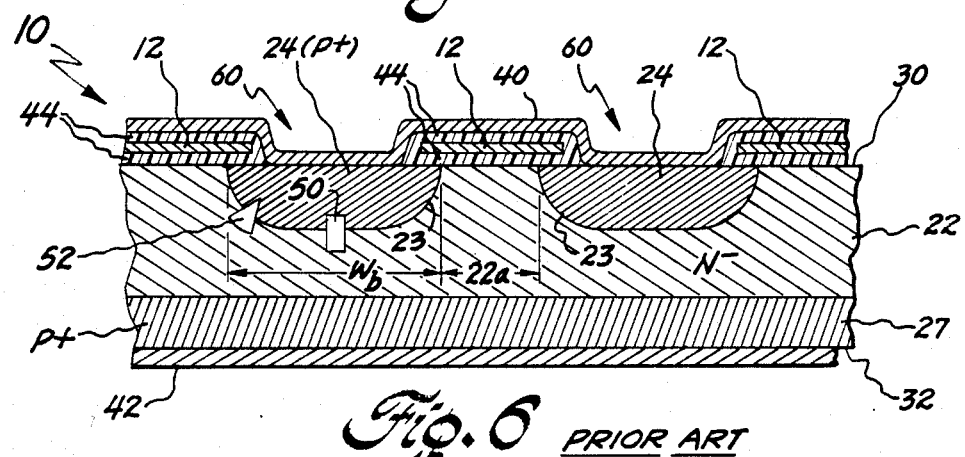

In the cross-section shown in FIG. 5, the vertical and horizontal relationships among the P+, P− and N+ diffused regions (24, 26 and 28, respectively) and the polysilicon gate 12 and the underlying lightly doped N type material 22 are illustrated. The P+ diffused regions 24 extend deeper into the N− layer 22 than the P− or N+ diffused regions 26 and 28. Along the cross-section in FIG. 5, the P− and N+ diffused regions extend further under the polysilicon than the P+ diffused region 24. The doping level of the P+ region is substantially higher than that of the P− region 26. By substantially higher doping, we mean that the more heavily doped region has a doping concentration which is at least an order of magnitude (that is at least a factor of ten) higher than the doping concentration in the other regions. In FIG. 5 the polysilicon 12, which comprises the gate electrode of the final device, extends over part of the N+ region 28, part of the N− region 22 and the portion of the P− region 26 between them. In FIG. 6 the P+ region 24 extends under the polysilicon 12. Insulating (dielectric) material 44 insulates the gate electrode 12 from the underlying semiconductor material and an overlying electrode 40. The overlying electrode 40 contacts the N+ diffused regions 28 and the P+ diffused regions 24. In so doing, it shorts the PN junction between the N+ region 28 and the P+/P− region on the side of the N+ region 28 more distant from the gate electrode 12. This is desirable because it helps to prevent latching when the device incorporates therein an insulated gate bipolar transistor (IGBT) portion as shown in FIG. 6 which includes a P+ layer 27 between layer 22 and the second power electrode 42 which is disposed in contact with the lower surface 32 of the semiconductor material. The width $W_e$ of the P+ diffused region 24 at the emitter sites as shown in FIG. 5 is less than the width $W_b$ of the P+ diffused region 24 at the minority carrier bypass sites 60 as shown in FIG. 6. This difference is seen more clearly in FIG. 4. The device in FIG. 5 would also be an IGBT if the P+ layer 27 were present there.

During device operation, application of a bias voltage to the gate electrode 12 is used to control conduction of electrons through channels 29 near the surface of the P− region 26 between the N+ emitters 28 and the N-region 22. This control can be either in an enhancement mode or a depletion mode with an appropriate bias applied at times when it is desired to hold the device in a different condition than occurs in the absence of gate bias.

To turn the device 10 on, an appropriate voltage is applied across the main electrodes 40 and 42 (for example, with electrode 42 more positive than electrode 40) and the gate electrode layer 12 is placed and held in a bias condition in which the channels 29 are conductive. Electrons then flow from electrode 40 into N+ emitters 28, horizontally through channels 29 and vertically through the N− region 22 to the electrode 42. In an IGBT such as shown in FIG. 6, holes simultaneously flow vertically upward in N− region 22 and across the PN junction 23 to the first electrode without entering N+ regions 28.

When it is desired to turn the device off, the bias condition of the gate electrode layer is changed to one which causes the channel 29 to close and block conduction of electrons from the emitters 28 to the N− region 22. At that point, i.e., with the channels blocked, the current in an MOS device has several significant components. These are (in the case of a MOSFET) (1) electrons remaining from the on-current, (2) hole and electron displacement currents associated with the increasing width of the depletion region as a result of the large reverse voltage applied across the device and (3) hole and electron avalanche currents. Other non-significant currents are also present. In an MOS bipolar device such as an IGBT, another current component, that comprised of holes in the base region 22, becomes significant because of the large number of holes there as a result of the bipolar injection of holes from the P+ region 27 while the device was on.

The components of device current other than the avalanche current are essentially independent of junction curvature, but the avalanche component is strongly effected by junction shape. The avalanche current is generated primarily at regions having high charge densities.

The causes of avalanche breakdown are the same in a MOSFET and an IGBT; however, for two devices which have the same MOS structure, the IGBT will break down at a lower voltage than the MOSFET under identical circuit conditions because of the presence of the additional hole charge which results from the bipolar nature of the IGBT.

When an inductive load is being controlled, the above-described turn off of the channel cannot immediately stop the load current because of the current maintenance characteristics of the inductive loads. This results in a substantial increase in voltage across the semiconductor device because the rapid change in load current causes a large di/dt in the inductive load which produces a high inductive load voltage. Consequently, the turn off of the channel causes the voltage across the device between electrodes 40 and 42 to increase to significantly more than the supply voltage. This puts considerable stress on the semiconductor device, especially when it is an IGBT and therefore has a large number of minority carriers in the N− body region 22.

The electric field across the high voltage blocking PN junction 23 terminates on charges within the semiconductor material and is sustained over a distance which is determined by the applied voltage, the shape of the junction and the quantity of mobile charge present. Along the flat portion of the PN junction, the size of the rectangular volume 50 (FIG. 6) required to enclose enough charge carriers to terminate the entire field determines the applied field strength and, under static conditions, depends on the doping level of the depletion regions and the applied voltage. Where the PN junction 23 curves upward toward device surface 30, the region in which the electric field is terminated changes to more of the sector or wedge shape shown at 52. This is because on the inside of the PN junction within the P+ region (the more highly doped side of the PN junction here), fewer carriers are available to terminate the field than on the outside of the junction because of the reduced volume of P type material per unit of junction area adjacent the junction as a result of the inward curving of the junction. Conversely, the junction shape results in charge carriers over a wider area being available on the N− type (more lightly doped here) side of PN junction 23 for terminating the field there. As a result, the applied voltage is terminated over a shorter distance into the N− material and over a longer distance into the P+ material at the curved portion of the junction than at a flat portion of the junction. This results in a higher electric field along the curve of the junction than along planar portions of the junction and the generation of more avalanche current at curved portions of the junction than along the planar portions of the junction As a result, the curved portion of the junction breaks down at a lower device voltage than the flat portion of the junction.

This effect is present along the entire straight edge of a diffused region where the resulting junction is a portion of a cylinder because the junction curves upward to the surface. The cylindrical portion of the junction typically breaks down at about 80% of the voltage at which a similar parallel plane junction breaks down. The effect of junction curvature is even more pronounced at corners A and B in the device shown in FIGS. 3 and 4 because the junction there is spherical so as to curve in two mutually perpendicular planes and the effects of these curvatures add, so that more avalanche current is generated at the spherical portions of the junction than at the cylindrical portion of the junction for a given device voltage. If the avalanche current becomes too great, the device breaks down. Consequently, it is the spherical portion of the junction which breaks down first in response to over voltage as a result of interrupting a high current in an inductive load. The spherical portion of the junction typically breaks down at about 60% of the voltage at which a similar parallel plane junction breaks down. Thus, the spherical portions of the high voltage blocking junction limit the device's safe operating area. What is significant is the curvature of the junction in three dimensions as shown in FIG. 4.

The field intensity at the junction is further increased by the presence of the mobile charge carriers in the on-state current which are still present during turnoff. Holes in region 22 are attracted toward the junction 23 by the reverse bias voltage and add to the positive charge in the depletion region (which extends outward from the junction 23 into the N− type material) as they cross that depletion region. That depletion region is depleted of electrons by the applied reverse bias, leaving positively charged donor atoms in the depletion region. This added mobile positive charge while present results in an increased electric field strength across the junction. These holes, which are accelerated by the electric field within the depletion region, can contribute to the generation of avalanche current by incurring ionizing collisions each of which generates a hole-election pair. The overall effect is that the presence of the mobile charge carriers which remain from the on-state current leads to avalanche breakdown at a lower device voltage than that at which avalanche breakdown would occur if those mobile charge were not present.

Those holes, which cross the PN junction 23 in the vicinity of the central conductive column 22a (FIG. 5), must pass through the P− region 26 underneath the emitter region 28 and then travel through P+ region 24 all the way to the electrode 40 in order to be collected by that electrode. This lengthy, relatively high resistance minority carrier path (especially through the relatively thin portion of region 26 between emitter 28 and body region 22) is a significant contributor to device turnoff time and can create a large enough voltage drop in region 26 to forward bias the PN junction between regions 26 and 28. Forward bias on this junction creates currents which can result in destruction of the device. It is for this reason that minority carrier bypass portion 60 of regions 24 such as those shown in cross-section in FIG. 6 are provided which have no emitter region. These carrier bypass regions 60 enable the holes to travel a much shorter and wider (and thus lower resistance) path through P+ region 24 from the junction 23 to the electrode 40 and thereby reduce the tendency to forward bias the junction between regions 26 and 28.

Figure 7:
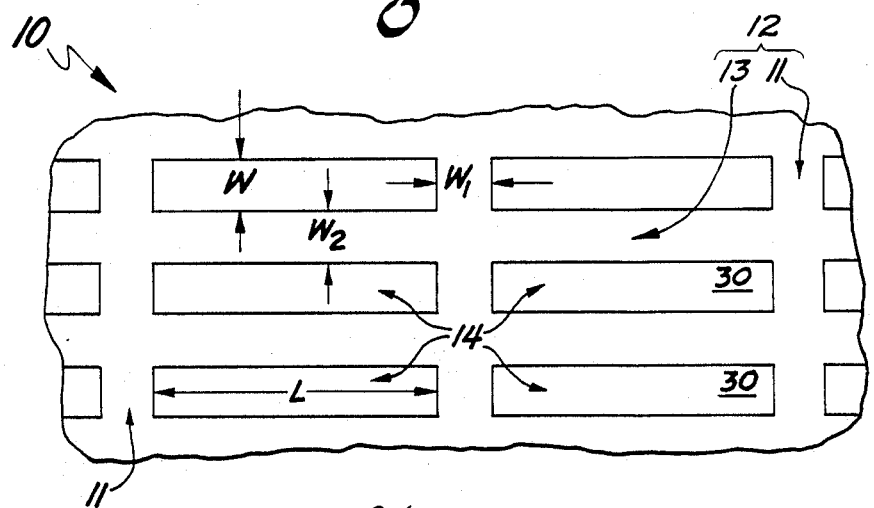
FIG. 7 is a plan view of a larger segment of the gate layer in the prior art device showing more windows.

A portion of prior art device 10 containing a plurality of windows 14 in polysilicon gate electrode 12 is illustrated in FIG. 7. These windows have a width $W_1$ and a length L. It is common practice in the industry to space the windows horizontally in the figure by cross connection segments 11 of the gate electrode having a width $W_1$ and to space them vertically in the figure by segments 13 of the gate electrode having a width $W_2$ and to make $W_1$ equal to $W_2$. The length L of the windows is somewhat arbitrary. The cross connection segments 11 of the gate electrode which separate the longitudinally aligned windows are included in the gate structure in order to provide a gate grid having a sufficiently high conductivity to avoid limiting device operating characteristics through gate delays. The width W of the windows is kept small to maximize the active area of the device. The width $W_2$ of the gate segments 13 which space the windows apart vertically in FIG. 7 is kept small for the same reason. In an IGBT designed to have a breakdown voltage of 500 volts, typical spacings and sizes are W=16 microns, L=300 microns, $W_1$=16 microns and an $W_2$=16 microns. From these dimensions, it is apparent that the drawings are not to scale and have the dimension W of the windows stretched relative to the dimension L since in the device the ratio W:L is 16:300 which is about 1:20. Thus, the gate segments 13 have a width-to-length aspect ratio which is far from unity. The length L of 300 microns is limited by the need to place cross connections 11 close enough together within the polysilicon gate grid to maintain the desired gate conductivity without using two levels of metallization while still retaining all the self alignment benefits provided by the double diffusion MOS fabrication techniques. This window length L is made as long as possible in order to maximize the active area of the device.

Our related application cited above describes how to raise the breakdown voltage of devices of this general type by modifying the base and emitter diffusion masks to avoid forming the spherical portions B of the junction 23 and by modifying the shape of the ends of the windows to convert the spherical portions A of the junction 23 into a cylindrical junction portion having a curved axis. It also teaches reducing the spacings between window ends to cause the base region diffusions thereunder to merge end-to-end to avoid forming junction ends in the vicinity of the window ends. The latter junction ends are replaced by cylindrical junctions having substantially straight axes, thus eliminating both spherical and curved axis cylindrical portions of the junction. This raises the breakdown voltage to substantially that of a cylindrical junction having a straight axis. The resulting structure exhibits maximized device performance when the lengths of the windows in the polysilicon gate are made as long as is consistent with sufficient gate grid conductivity to prevent gate delays from limiting performance since that maximizes the device's active area. Theoretical modeling of devices in accordance with the aforementioned related application indicates that the safe operating area of the device can thereby be increased by a current (amperage) factor of about 2.6. Experimental devices (which have not been fully optimized) fabricated in accordance with the aforementioned related application have demonstrated an actual improvement factor as large as 1.75.

PREFERRED EMBODIMENT

Our present invention is founded on controlling the configuration of the high voltage blocking junction to maximize the voltage at which it produces enough avalanche current to cause device breakdown.

Figure 8:
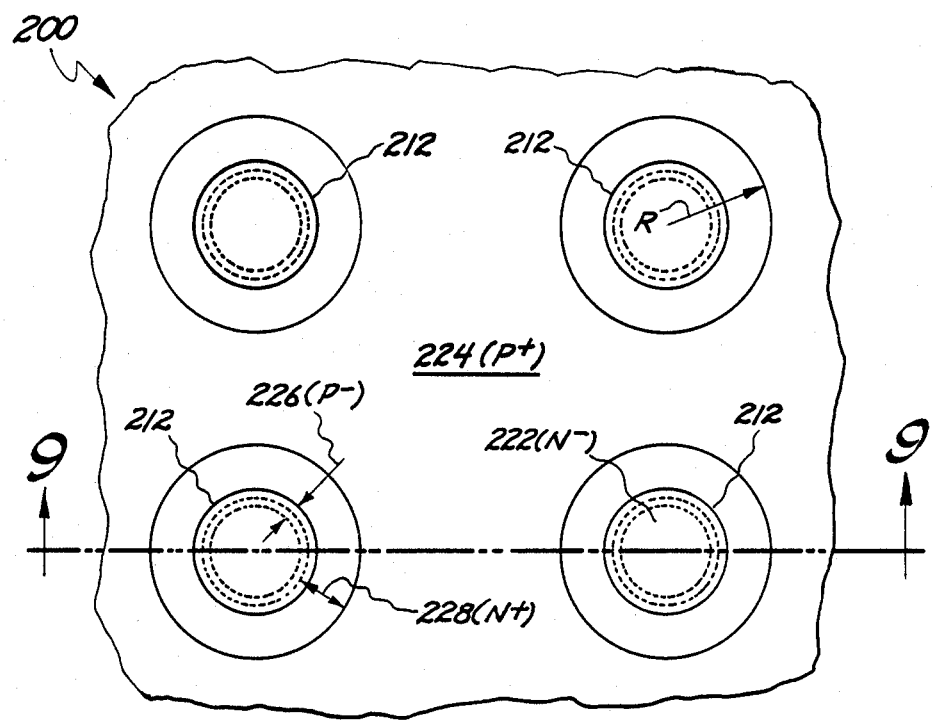
FIG. 8 is a plan view of a device in accordance with the present invention showing four isolated circular gate segments and the location at the semiconductor surface of the diffused regions in the vicinity of those segments.
Figure 9:
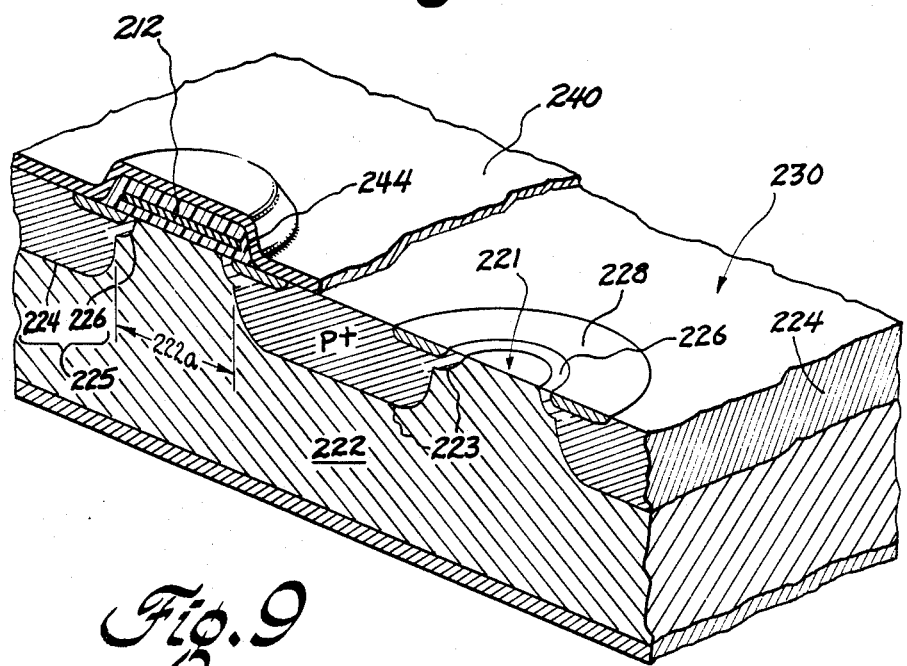
FIG. 9 is a perspective view showing a cross-section through the device of FIG. 8 taken along the line 19—19 with part of the gate insulation and polysilicon gate removed and part of a power electrode shown.
Figure 10:
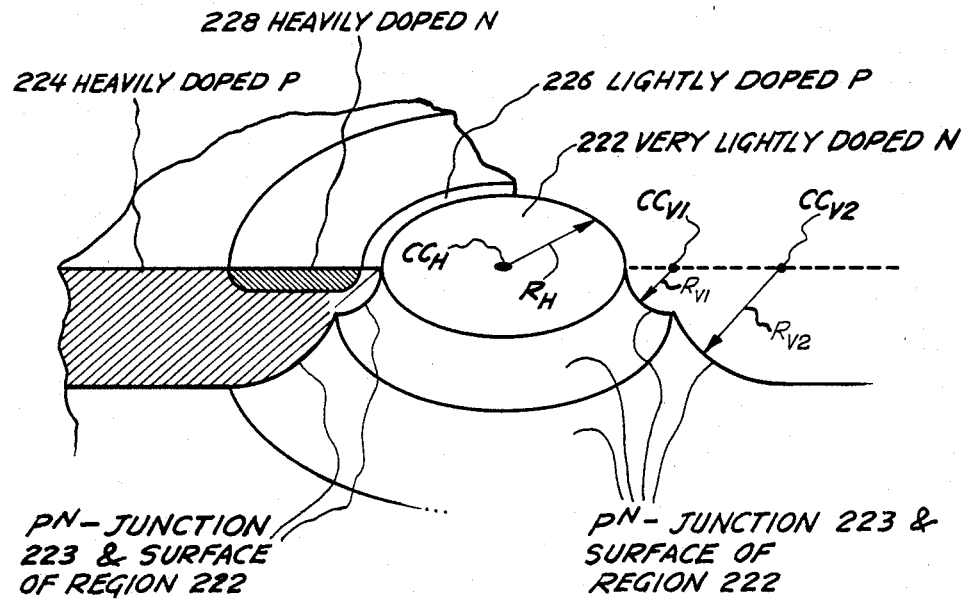
FIG. 10 is a perspective, partially cutaway, partially cross-section view of a portion the structure of FIG. 7.

In accordance with the present invention, the breakdown voltage of such devices can be raised to significantly more than that of a device with a corresponding cylindrical junction having a straight axis by modifying the shape and size of the overlap between the gate electrode and the body region of the device to provide a cylindrical junction whose axis curves in the opposite sense from the round window ends in our related application and by making the radius of curvature of that axis small. A breakdown voltage which is higher than that of a cylindrical junction having a straight axis is thus obtained in the active portion of the device. In a device in which the high voltage blocking PN junction extends to the semiconductor surface in the central portion of the device (its active area), the breakdown voltage of a cylindrical junction with a straight axis has been considered the upper limit on attainable breakdown voltage in that portion of the device. Thus, the present invention exceeds prior art capabilities and recognized limits with respect to junction breakdown voltage in the active portion of the device. This increased breakdown voltage is obtained by providing the base/body region PN junction with a configuration which, at the device surface, encloses a portion of the body region which is a closed plane geometric figure that is everywhere convex or has a maximum width of less than about a depletion width in the body region at breakdown. The maximum radius of curvature of that geometric figure is preferably made small to maximize the increase in breakdown voltage. It is preferable to reduce the junction curvature to as great an extent as is consistent with providing the device with adequate on-state conductivity The geometric figure at the surface is preferably a circle because a circle has a uniform radius of curvature and produces the largest breakdown voltage. An exemplary device 200 having this configuration is shown in plan view in FIG. 8 and in a cross-section in FIG. 9 in which a power electrode 240 (not shown in FIG. 8) is included FIG. 8 shows four isolated circular polysilicon active gate segments 213 each having a radius R which, in the exemplary device, results in a maximum width for these gate segments equal to their diameter 2R. In FIGS. 9 and 10, part of the gate layer has been removed and the overlying power electrode is only shown over part of the semiconductor area.

Throughout the drawings different devices of the invention are given reference numerals with different prefixes based on 100, 200 and 300 number series. Similar or corresponding structures retain the same final two digits in their reference numerals from device to device.

The invention is applicable to a variety of field effect power devices and is most effective in those devices having a double diffused (DMOS) field effect structure in which current flow is vertical (sometimes referred to as VDMOS to distinguish it from those DMOS devices in which current flow is lateral which are then referred to as LDMOS devices). Such devices can include devices whose operation is based exclusively on field effects such as MOSFETs; devices which combine field effect and bipolar structures such as insulated gate thyristors, insulated gate turn off thyristors and insulated gate bipolar transistors (IGBTs); and devices whose operation is exclusively bipolar such as power transistors. In general the invention is useful in semiconductor devices whose safe operating area is limited by the breakdown voltage of their high voltage blocking PN junctions.

The invention is applicable to devices having a single active gate electrode segment 213 (FIGS. 8-10). However, in order to provide a device with high current capability, a plurality (several hundred to several thousand) of such gate segments are considered desirable to maximize total channel width in the device. In device 200, away from the active gate segments 213, the surface of the underlying semiconductor body is a P. doped region 224. An annular P— region 226 underlies each active gate segment 213 at the semiconductor surface An annular N+ emitter region 228 is disposed within region 226 in the vicinity of each gate segment 213 and extends under the gate segment 213 and outward away from the gate segment 213 a sufficient distance to be contacted by the main power contact 240 which contacts the P+ region 224. Below the semiconductor surface the P— region 226 is continuous with the P. region 224. Regions 224 and 226 together comprise a single base region 225 which extends throughout the active region of the device and has openings 221 therein where the body region 222 extends to the surface 230.

Figure 11:
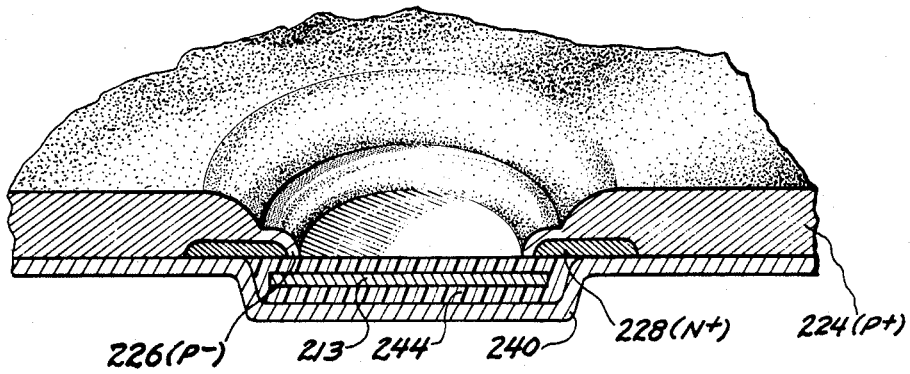
FIG. 11 is an inverted, perspective view showing a section of a portion of the inventive device similar to the FIG. 4 view of the prior art device.

Referring to FIG. 6 and the two volumes 50 and 52 therein used above in explaining the problem which causes the higher field at the curve in the PN junction, it can be seen that the two separate curvatures are present in the device structure shown in FIG. 9 and more clearly in FIG. 10, and shown in an inverted position in FIG. 11. Along the front and righthand sides of FIG. 10, all P— and P+ material has been omitted from the device, leaving only body region 222. In the structure shown inverted in FIG. 11, as compared to FIGS. 9 and 10, only the P+ diffused region 224, the P— diffused region 226, the gate segment 213, its insulating layer 244 and the power electrode 240 are shown. In FIG. 10 the center of curvature of the junction between regions 226 and 222 is indicated at $CC_{V1}$ with a radius of curvature $R_{V1}$ and the center of curvature of the junction between regions 224 and 222 is indicated at $CC_{V2}$ with a radius of curvature The center of curvature of the planar circle at the device surface is at $CC_H$ and the circle has a radius $R_H$ which varies with depth in the semiconductor material, being smallest at the surface and becoming larger at greater depths as a result of the curvature of the regions 226 and 224. In the region where the PN junction 223 is curving upward in the plane of the cross-section in FIG. 9, the junction 223 appears substantially identical to the junction 23 in FIG. 3. That is, the centers of curvature ($CC_{V1}$ for region 226 or $CC_{V2}$ for region 224) of the curving portion of the junction 223 are inside of the more highly doped base region (224 or 226). This is a curvature which tends to lower the breakdown voltage of a PN junction as compared to that of a corresponding parallel plane junction A parallel plane junction which corresponds to junction 223 is a junction between two regions whose interface is everywhere in a single plane and which have the same doping concentrations as the regions which form the PN junction 223. In the plane of the cross-section of FIG. 9, the shape of junction 223 cannot be distinguished from that of the cylindrical junction 23 in FIG. 3 which has a straight axis and in which the inside of the cylinder (region 226) is more highly doped than the outside of it (region 222) is. Thus, since the lowest breakdown voltage segment of a PN junction controls its breakdown voltage, this PN junction would be expected to have a breakdown voltage which is no higher than that of a corresponding cylindrical junction having a straight axis, i.e., the breakdown voltage of the prior art device. This curvature will be referred to as "cylindrical curvature".

A corresponding cylindrical junction having a straight axis is formed between a diffused base region and a body region into which that base is diffused where those regions have the same doping levels as the regions in question and in which the base region has the same depth, so that the radius of curvature of the junction in a plane perpendicular to the semiconductor surface is the same in both cases.

The initial impression given by the curvature of the junction in the plane of the semiconductor surface 230 is that this curvature will increase the overall junction curvature and further decrease the breakdown voltage in a manner similar to that at a spherical corner. However, this curvature is in the opposite sense from that in the cross-sectional plane and at a spherical corner because the material on the inside of this curve (body region 222) has a lighter doping concentration than the material on the outside of this curve (the base region 226). This is a curvature which, considered only in the plane of surface 230, tends to decrease the field strength and increase the breakdown voltage of a PN junction to above that of a corresponding parallel plane PN junction This curvature will be referred to as "reverse" curvature. A junction has a desirable curvature (higher breakdown voltage or reverse curvature) if the more lightly doped region has a convex boundary like that of the circular region 222 at the semi conductor surface, i.e., its center of curvature is within the lightly doped region rather than the more highly doped region.

The curvature of PN junction 223 in a plane parallel to the semiconductor surface 230 is a reverse curvature while the curvature of PN junction 223 in a plane perpendicular to the surface 230 is a cylindrical curvature. Thus, the shape of this junction produces two competing curvatures, (1) a cylindrical one which tends to increase the field strength at the junction to more than that of a corresponding parallel plane junction and thus tends to lower the junction's breakdown voltage and (2) a reverse one which tends to decrease the field strength to less than that of a corresponding parallel plane junction and thus tends to raise the breakdown voltage. These two curvatures combine to produce a junction curvature in three dimensions which is less detrimental than a cylindrical curvature with a straight axis. The smaller the radius of the horizontal circle and the larger the radius of curvature in the vertical plane, the more nearly the overall junction breakdown voltage will approach the desirably high breakdown voltage of a corresponding parallel plane junction.

In our related application, the windows in the gate are given semicircular ends to reduce the curvature at the ends of the windows from spherical at the corners to a cylindrical junction at the end with an inward curving axis (a contour which is better than spherical, but not as good as cylindrical with a straight axis) and/or the window ends are placed close enough together that the base regions diffused therethrough merge to eliminate those junction ends and leave a cylindrical junction edge with a straight axis along the lengths of the window rows.

The structure in FIGS. 8-11 improves on that structure by carrying that straightening process beyond straight by bending the axis of that cylindrical junction in the opposite sense to provide a reverse curvature so that the PN junction encircles the more lightly doped region rather than the more highly doped region. This raises the breakdown voltage of that junction because the curvatures in these two different planes add algebraically to determine the junction curvature and (unlike the prior art devices) have opposite signs so that the curvature in planes parallel to the semiconductor surface compensates for some of the curvature in planes perpendicular to the semiconductor surface thereby reducing the electric field at the junction.

Design wise, this is done by providing the segments of the gate electrode which are wide enough to prevent the merger of diffusions thereunder (the circular active gate segments 212 in FIGS. 8 and 9) with a width to length aspect ratio which is close to unity unlike those segments in the prior art or the related invention and preferably by making the boundary of the body region in the plane of the semiconductor surface under those gate electrode segments everywhere convex. This yields a junction shape which is a cylindrical junction having a reverse curved axis.

Our studies and experiments have confirmed that in a structure of this type, the breakdown voltage is increased over that of a cylindrical junction having a straight axis. The increase in breakdown voltage becomes larger as the maximum width of the active gate segment is decreased. It is preferred that the radius of curvature in the plane of the semiconductor surface be less than about $D_B$, where $D_B$ is the depletion width at breakdown of a corresponding parallel plane PN junction between the same regions (about 60 microns for a breakdown voltage of 500 volts), and preferably be much less than $D_B$ (about 10 microns, for example, in which case the diameter or maximum width of the circular gate is about one third $D_B$). A typical radius of curvature of the junction in a plane perpendicular to the surface plane is about 5 microns for a high voltage device designed to hold off a voltage of 500 volts. A circular active gate segment width (diameter) of less than one half $D_B$ is considered desirable.

The structure of the device 200 (FIG. 8) will raise the PN junction breakdown voltage, but unfortunately, it suffers from two practical problems. First, the active insulated gate electrode segments 212 are difficult to contact since they are isolated from each other and two levels of metallization would be needed in order to separately contact them and the base regions 224 and 226 and second, no minority carrier bypass is provided.

Figure 12:
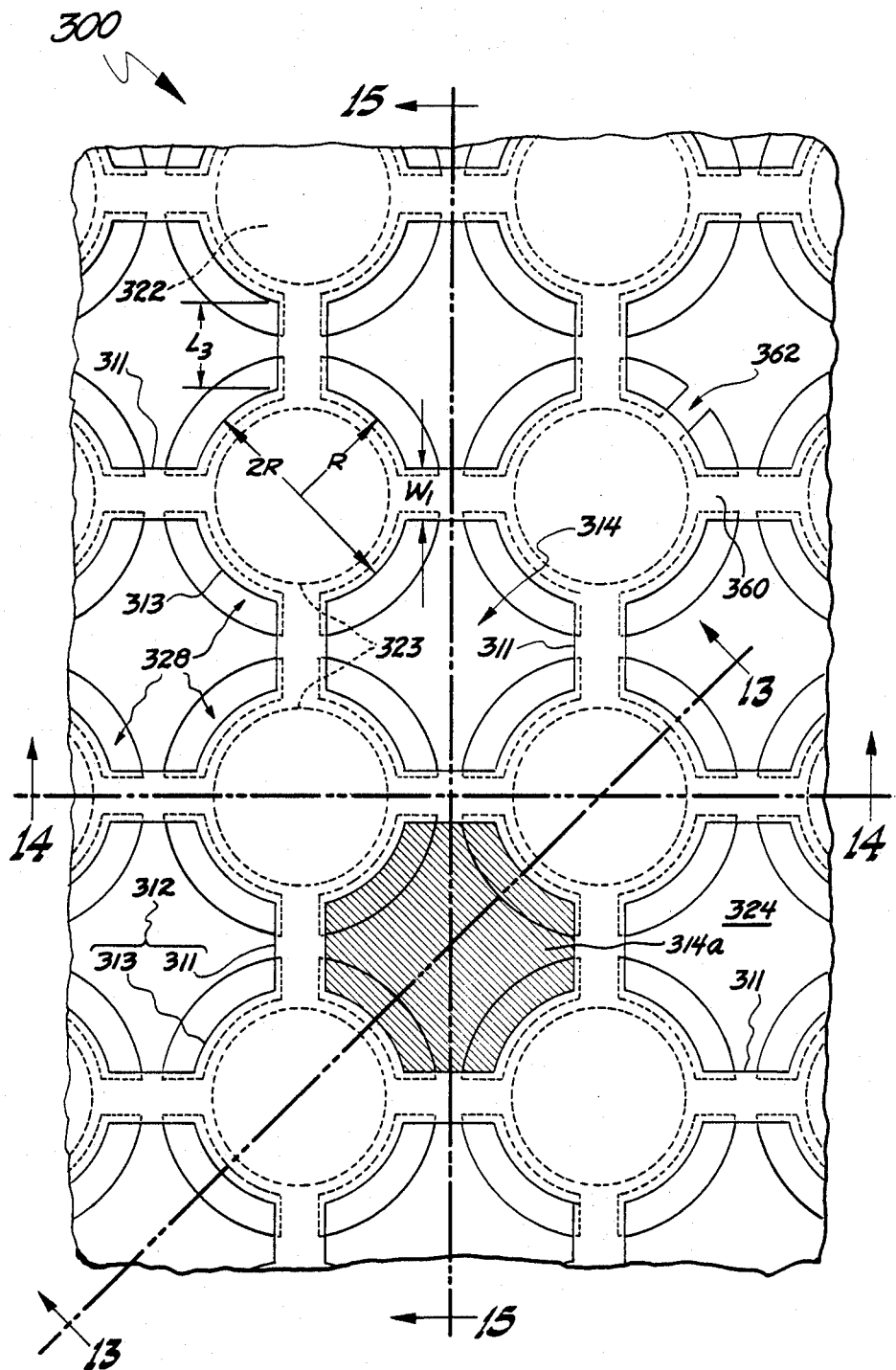
FIG. 12 is a plan view of a portion of a device in accordance with the present invention having a lattice network of interconnected active gate regions.

FIG. 12 shows in plan view a portion of a device 300 in accordance with this invention having a gate grid 312 which is a rectangular lattice of circular active gate segments 313 interconnected by rectangular bridges 311. This device layout is referred to as an atomic lattice layout. This device structure overcomes both of the practical problems of device 200 shown in FIG. 8. Various array configurations may be used. These include arrays in which the centers of the active gate segments 313 form an array unit cell which is a square (FIG. 12), a rectangle, a triangle, a rhombus, a hexagon, other repeating patterns or arrays in which the positions of the centers of the circles are random. The circles may be of varying sizes, and shapes other than circles may be used, such as ellipses and polygons, but circles of uniform size are preferred because they minimize the maximum radius of curvature of the junction at the semiconductor surface.

The gate lattice 312 is created by forming openings or windows 314 in a continuous layer of gate material. One of the windows, identified as 314a, is hatched in FIG. 12 to clearly show the shape of the windows 314. These windows have concave corners such that four mutually adjacent windows define one circular active gate segment 313 under which the high voltage blocking PN junction extends to the semiconductor surface. The resulting gate lattice 312 includes circular active gate segments 313 and rectangular (inactive) bridge segments 311. The bridge segments 311 are considered inactive because they do not control conduction of current between the emitters 328 and the body region 322. However, they form a necessary part of the gate grid where the external contact to the gate grid is located away from the active portion of the chip. Devices in accordance with this structure are preferably fabricated using double diffusion techniques in order to accurately control channel length.

The circular gate segments 313 have a polysilicon radius R of about 10 microns, i.e., a diameter or maximum width 2R of about 20 microns, and the bridges 311 have a length $L_3$ of about 8 microns and a width $W_1$ of about 4 microns. The emitter regions are diffused under the gate electrode about 1 micron, in a direction parallel to the plane of the electrode. Many variations on these values may be used in accordance with desires to optimize different device characteristics and the intended device application.

The radius R is selected to maximize breakdown voltage while still providing a large enough central column 322a (FIG. 13) and sufficient channel width to provide an acceptable forward voltage drop in the on-state. The total channel width of the device is the circumference of the channel region of the low concentration base region 326 minus four times (in this four-bridge-per-circle embodiment) the width of the gap under the bridges 311 (FIG. 12) in which no N+ region 328 is present, all times the total number of circular gate regions. The bridge length $L_3$ is selected to provide an adequate area between the circular gate regions to perform the required diffusions, to provide sufficient contact area for the power electrode and to provide adequate minority carrier bypass sites 360 (FIG. 12) by omission of the emitter region along part of the bridge's length. This omission of the emitter region is not essential, but improves device performance. Alternatively, or in addition, minority carrier bypass sites may be provided by masking part of the emitter diffusion along the circular portion of the gate segment away from the bridges as shown at 362 in FIG. 12. The bridge width $W_1$ is selected to be narrow enough to ensure that the P− regions diffusing from opposite sides of a bridge will merge under it and to be wide enough to provide adequate conductivity through the gate lattice This merger of the P− diffusions, which proceed from opposite sides of the bridges, restricts the intersection of PN junction 323 with the device surface to a plurality of circles, each of which lies entirely under one of the circular active gate segments 313.

The regions 324 and 326 together form a single continuous P type base region which will be referred to as base region 325, as shown in FIG. 13 Base region 325 includes different portions diffused from different dopant source concentrations which have significantly different doping levels (e.g., P+ region 324 has substantially heavier doping than P− region 326). This single continuous base region is produced by each of the base diffusions merging with those adjacent to it under the polysilicon bridges 311, and increases device safe operating area. This structure constitutes a MOSFET which can withstand relatively high dosages of gamma radiation which generates hole-electron pairs that introduce mobile minority carriers into an MOSFET which stress the structure in the same manner as do the minority carriers in an IGBT. The single region 325 includes a plurality of circular openings 321 in which the body material 322 extends or protrudes to the top substantially planar surface 330 of the semiconductor material. The PN junction 323 between body 322 and base region 325 is remote from surface 330 except at the openings 321. The base region 325, which surrounds the openings 321, is wider at the surface than it is further into the wafer, and therefore the openings 321 (and the body material 322) are narrowest at the surface and become progressively wider deeper into the wafer until the material 322 becomes a single uniform layer below the maximum depth of the base region 325.

In FIG. 14, an additional layer 327 of P type material is provided between N− type layer 322 and lower electrode 342 in order to make the device an IGBT. The devices in FIGS. 13 and 15 would also be IGTs if a layer 327 were included in them between region 222 and electrode 342. The inclusion in FIG. 13 of a heavily doped portion 322b in region 322 adjacent electrode 342 provides good ohmic contact in a MOSFET between electrode 342 and region 322. In a MOSFET, region 322 is the drain, region 328 is the source, electrode 340 is the source electrode and electrode 342 is the drain electrode. The region 322 is often referred to as the drift region in both MOSFETs and IGTs. In FIG. 14, the continuous nature of the gate grid 312 along the line 14—14 in FIG. 12 is apparent. The transitions between active gate circles 313 and bridges 311 is illustrated along the top of FIG. 14.

FIG. 15 shows the merger of the P− diffusions 326 under the bridges 311 with a slight cusp in the lower surface of the merged region and the continuous nature of the region 325 across a number of windows 314 in the gate grid.

A 400 volt breakdown voltage is considered to be the minimum adequate value for turning off an inductive load across a 100 volt ac line (315 volts peak-to-peak) without the use of extra protection circuitry such as a snubber capacitor. A P type IGT (i.e., having the region conductivity types reversed from those shown in the figures) having the previously-described prior art configuration has a 400 volt breakdown voltage when the total charge concentration in the depletion region is $1.68 \times 10^{14}/cm^3$. This total charge is a combination of the fixed charges of the dopant atoms and mobile charge which results from current flow. Current flow adds charge in the depletion layer of PN junction 23 within the body region 22 which is equal to $$N = \frac{J_F}{qV_S}$$

where $J_F$ is the current density and $V_S$ is the saturated drift velocity for electrons (minority carriers in this situation) which is $1 \times 10^7$ cm/sec at 300° K. in silicon. In a P− region having a resistivity of 150 ohm-cm which corresponds to a doping concentration of $0.9 \times 10^{14}/cm^3$ the total charge limit of $1.68 \times 10^{14}/cm^3$. allows a maximum current induced charge of $0.78 \times 10^{14}/cm^3$. This corresponds to a current density of 130 A/cm², which for a chip having an active area of 0.2 cm², results in a maximum turn off current of 26 amps.

With a device in accordance with FIGS. 12-15, a 400 volt breakdown voltage is achieved with a total charge of $3.8 \times 10^{14}/cm^3$ in the depletion layer of PN junction 323 within body region 322. For 150 ohm-cm material, this corresponds to a current induced charge of $2.9 \times 10^{14}/cm^3$ and corresponds to a current density of 483 A/cm². Thus, a 26 amp current can be turned off by a chip of this structure (FIGS. 12-15) with an active area which is 3.7 times smaller than that required by the prior art structure shown in FIGS. 1-7.

Experimental devices in accordance with FIGS. 12-15 which are not fully optimized have demonstrated a 2.4 times higher current limit on safe operating area for the inventive structure as compared to the prior art structure.

Experimental devices (not fully optimized) in accordance with the highest breakdown voltage embodiment of the invention in our related application and in accordance with FIG. 12 of this application, and commercial production versions of devices having the prior art structure shown in FIGS. 1-7, were fabricated by diffusion using chips of the same size (6×6 mm). The doping levels and the region thicknesses in all three device types were the same. The body regions (22 and 322) had doping concentrations of $0.9 \times 10^{14}/cm^3$, the base region high concentration portions (24 and 324) had surface dopant concentrations of $5 \times 10^{19}/cm^3$, the base region low concentration portions (26 and 326) had surface dopant concentrations of $2 \times 10^{17}/cm^3$ and the emitter regions (28 and 328) had surface dopant concentrations of $1 \times 10^{19}/cm^3$. The high concentration base portion depths were about 6 microns, low concentration base portion depths were about 4 microns and emitter depths were about 1 micron. Some of the device characteristics are tabulated in the TABLE with the results for each type of device normalized to the values for the prior art device.

TABLE

| Device Design | SOA Current for 400 volts | Input Capacitance (picofarads) |
| --- | --- | --- |
| Prior Art | 1 | 1 |
| Related Application | 1.75 | 0.9 |
| This Invention | 2.4 | 0.5 |

The TABLE indicates that the experimental devices in accordance with this invention provide a safe operating current which is 2.4 times greater than that in the prior art device and have an input capacitance which is one-half that of the prior art device, both of which are significant improvements over the prior art. Those skilled in the art will recognize that the invention is effective for wide ranges of dopant concentrations and regions depths and does not depend on the specific doping levels present in these devices for its success.

Some reasons for this low capacitance are apparent upon a brief study of FIGS. 7 and 12. First, there is a much smaller overlap between the gate electrode and the body region (322) in the present invention than there is in the prior art device. One reason for this is that in the inventive device the diffused regions are formed by diffusion inward under a small gate electrode from outside. This shrinks the body region 322 which is overlapped by the gate electrode to as small a dimension as is permitted by the required device operating characteristics. Second, a smaller percentage of the device surface is covered with gate material in the present invention (FIG. 12) than in the prior art device. Overall, the gate overlap of body region 322 is reduced significantly.

It will be understood by those skilled in the art that the improvement in device performance which this invention provides can be used in a variety of ways. As discussed above, for an IGBT, it can be used to reduce chip size for a given current and voltage limit on the device's SOA. For a power MOSFET, this invention can be used to give the drift region a higher doping level and make it thinner because of the narrower depletion region in more highly doped material. Both of these changes will reduce on-resistance for a given chip size and breakdown voltage. Other appropriate tradeoffs are made possible by the invention and their implementation is a matter of design choices and the specifications it is desired to meet.

A theoretical comparison between square cell MOSFETs ($W=W_1=W_2$) and ones having the inventive atomic lattice layout cell configuration shows that for the square cell design to have a 100 volt breakdown voltage requires the epitaxial layer which comprises the body (drift region) of the device to have a resistivity which, for minimum on resistance, is about three times the ideal value (that required for a parallel plane structure), resulting in an on resistance which is about 20 times the ideal value and a drain overlap capacitance (the capacitance of the capacitor formed by the gate electrode, the gate oxide and the drain region) which is about 0.4 times the ideal case. In accordance with the present invention, the epitaxial layer resistance is less than 1.5 times the ideal case and yields an on-resistance which is only ten times the ideal case with a drain overlap capacitance of about 0.2 times the ideal case. This smaller capacitance is desirable because it reduces gate delays caused by the RC time constant of the gate grid structure. Thus, MOSFETs in accordance with this invention can provide a two-to-one improvement over square cell MOSFETs in epitaxial layer resistivity, on-resistance and drain overlap capacitance.

Devices in accordance with this invention can be made via diffusion from a dopant source which is provided by surface deposition or ion implantation.

Many variations on the structures in the illustrative embodiments are possible without departing from the spirit of the invention or the scope of the appended claims. By way of example, and not limitation, the gate lattice of FIG. 12 can be varied by omitting selected ones of the bridge segments 311 to increase the channel width under selected active gate segments 313. This can be done to provide a lattice which is sparse in bridges (a sparse lattice) having only those bridges required in order to interconnect all of the gates and to provide sufficient gate grid conductivity to each gate. In general, the wider the bridges 311 are, the more of them can be eliminated without adversely affecting device performance. Further, if the gate grid is contacted by metallization outside the device active area beyond the edge of the main electrode metallization (as can be done by providing vias through the insulation over the gate segments 313 in that region and then depositing metallization thereon), then the number of bridges required for conductivity reasons decreases as the center of the lattice is approached. The polysilicon gate may be silicided and/or other gate materials may be used. In structures which do not use double diffusions to control channel length, the structure may also be formed by ion implantation followed by annealing or other fabrication and doping techniques.

The conductivity type of all the regions in any of the illustrated devices can be reversed to create a device of the opposite polarity.

The configuration of the high-voltage blocking PN junction is also useful in strictly bipolar devices such as power transistors in order to raise the base/collector juntion's breakdown voltage in the active area of the device.

Where the curvature of the high voltage blocking junction in the vicinity of the surface is the breakdown voltage limiting topographical feature of the device, the relative dopings of the body and base regions can be adjusted to maximize breakdown voltage if desired.

Reducing the size of the chip has a significance beyond merely increasing the number of chips which can fit on a given wafer for fabrication which, for a constant yield, increases the number of good chips per wafer. In addition, the smaller chip size promotes an increase in yield. These effects combine to provide a substantial increase in the number of good chips per wafer and thus a substantial reduction in the cost per chip since processing cost is allocated per wafer.

Thus, a VDMOS device structure exhibiting increased safe operating area without (1) increased physical area, (2) increased resistance or thickness of the drift region or (3) significantly reduced gate conductivity has been shown and described.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A semiconductor field effect device comprising:
   a body of semiconductor material having a major surface; and
   an insulated gate electrode grid disposed on said major surface, said grid comprising:
      as plurality of spaced apart first gate segments, each of said first segments being substantially circular, and
      a plurality of second gate segments, each of said second segments extending between, and interconnecting, two adjacent one s of said first segments.

2. The semiconductor field effect device recited in claim 1 wherein:
   said first gate segments each have a radius R, and
   said second gate segments have a minimum width $W_1$, wherein R is greater than $W_1$.

3. The semiconductor field effect device effect device recited in claim 2 wherein R is greater than $2W_1$.

4. A semiconductor device comprising a body of semiconductor material having:
   a first major surface;
   a first region of one type conductivity extending to said first major surface;
   a second region of opposite type conductivity extending into said first region from said first surface and forming a PN junction with said first region; and
   an insulated gate electrode grid disposed on said first major surface, said grid comprising:
      a plurality of spaced apart first gate segments, and
      a plurality of second gate segments, each of said second gate segments extending between and interconnecting, two of said first gate segments,
   said second region being more heavily doped than said first region and having a plurality of spaced apart openings therein at which said PN junction and said first region extend to said first surface, each of s° i openings being substantially aligned with a different said first gate segments, and at each of said openings, the intersection of said PN junction with said first major surface being a closed plane geometric figure having a maximum width of less than 4 $D_B$ wherein $D_B$ is the break voltage depletion width for a parallel plane PN junction between said first and second regions.

5. The semiconductor device recited in claim 4 wherein said geometric figure is everywhere convex.

6. The semiconductor device recited in claim 5 wherein said maximum width is less than $2D_B$.

7. The semiconductor device recited in claim 5 wherein said maximum width is less than $D_B$.

8. The semiconductor device recited in claim 5 wherein said maximum width is less than $\frac{1}{2}D_B$.

9. The semiconductor device recited in claim 5 wherein said geometric figure is an ellipse.

10. The semiconductor device recited in claim 5 wherein said geometric figure is a circle.

11. The semiconductor device of claim 5 wherein said PN junction is remote from said first surface except in the vicinity of said openings, wherein said PN junction extends upward toward said first surface.

12. The semiconductor device recited in claim 11 wherein at each of said openings said PN junction curves upward toward said first surface, with each of said openings being narrower at said first surface than at a location remote from said first surface.

13. The semiconductor device recited in claim 11 further comprising:
   a plurality of third regions of said one type conductivity each disposed in said second region in the vicinity of one of said openings, extending to said first surface and spaced from said first region by a portion of said second region; and
   wherein:
      each of said first gate segments overlies a portion of one of said openings, a portion of one of said third regions in the vicinity of said one opening and the portion of said second region which spaces said one of said third regions from said first region.

14. The semiconductor device recited in claim 13 wherein said first region includes a first portion and a second portion, said second portion being substantially more heavily doped than said first portion, said first portion spacing said second portion from said second region;
   said device further comprising:
      a first power electrode contacting said second and third regions, and
      a second power electrode contacting said second portion of said first region.

15. The semiconductor device recited in claim 13 further comprising:
   a fourth region of said opposite type conductivity disposed adjacent said first region and spaced from said second region by said first region;
   a first power electrode contacting said second and third regions; and
   a second power electrodes contacting said fourth region.

16. The semiconductor device recited in claim 1 wherein each of said second gate segments extend over said second region between said two of said first gate segments it interconnects.

17. The semiconductor device of claim 16 wherein said second region extends a distance D under said first gate segment and said second gate segments have a minimum width $W_1$ wherein $2D > W_1$.

18. The semiconductor device recited in claim 4 wherein:
   said openings are substantially circular; and
   said first gate segment are substantially circular.

19. The semiconductor device of claim 4 further comprising:
  a plurality of third regions of said one type conductivity each extending into said second region in the vicinity of one of said openings and spaced form said first region by a portion of said second region; and
  the one of said first gate segments which is aligned with said one of said openings also being aligned with a portion of each of said third regions and the portions of said second region which space said third regions from said first region.

20. The semiconductor device recited in claim 19 wherein said first region includes a first portion and a second portion, said second portion being substantially more heavily doped than said first portion, said first portion spacing said second portion from said second region;
  said device further comprising:
    a first power electrode contacting said second and third regions and
    a second power electrode contacting said second portion of said first region.

21. The semiconductor device of claim 19 further comprising:
  a fourth region of said opposite type conductivity disposed adjacent said first region and spaced from said second region by said first region;
  a first power electrode contacting said second and third regions; and
  a second power electrode contacting said fourth region.

22. The semiconductor de vice recited in claim 5 wherein said second region of opposite type conductivity includes separately doped portions having different concentrations of opposite conductivity type determining dopant.

23. A semiconductor field effect device comprising a body of semiconductor material having:
  first and second major surfaces;
  a first region of one type conductivity material extending to said first major surface;
  a second region of opposite type conductivity more heavily doped than said first surface and forming a first PN junction therewith, said second region having a plurality of openings therein at each of which said first region extends to said first surfaces;
  a third region of said one type conductivity extending into said second region form said first surface and spaced from said first region by said second region; and
  an insulated gate electrode having a plurality of spaced part first segments each overlying said first layer wherein it extends to said first surface at a different one of said openings, one of said first gate segments overlying the portion of said second region which spaces said third region from said first layer and a portion of said third region;
  said insulated gate electrode including a plurality of second segments each of which connects two of said first gate segments;
  said first PN junction intersecting said first major surface under said gate electrode layer at each of said openings, each of said intersections comprising a closed plane geometric figure whose center is within said first region and whose maximum width is less than 4 $D_B$ where $D_B$ is the breakdown voltage depletion width of a parallel plane PN junction between said first and second region.

24. The semiconductor device re cite in claim 23 wherein said first region includes a first portion and a second portion, said second portion being substantially more heavily dope d than said first portion, said first portion spacing said second portion form said second region;
  said device further comprising:
    a first power electrode contacting said second and third regions, and
    a second power electrode contacting said second portion of said first region.

25. The semiconductor field effect device recited in claim 23 further comprising:
  a fourth region of said opposite type conductivity adjacent said first region and spaced from second region by said first region;
  a first power electrode contacting said second and third regions; and
  a second power electrode contacting said fourth region.

26. A semiconductor device comprising a body of semiconductor material having:
  a first major surface;
  a first region of one type conductivity;
  a second region of opposite type conductivity extending into said first region form said first surface and forming a PN junction with said first region;
  said second region being more heavily dope than said first region and having a plurality of openings therein at which said PN junction and said first region extend to said first surface, each intersection of said PN junction with said first major surface being a closed plane geometric figure which is everywhere convex; and
  a plurality of third regions of said one type conductivity extending into said second region from said second surface and spaced from said first region by said second region;
  an insulated gate electrode grid disposed on said first major surface, said grid comprising:
    a plurality of spaced apart first gate segments, each of said first gate segments overlying a different one of said plurality of openings, extending across the portion of said second region which is disposed between said first region within said opening and one of said third regions which is disposed adjacent thereto and being spaced from the others of said openings, and
    a plurality of second gate segments extending between, and interconnecting two of said first gate segments.

27. The semiconductor device recited in claim 26 wherein said first region includes a first portion and a second portion, said second portion being substantially more heavily doped than said first portion, said first portion spacing said second portion form said first region; and
  said device further comprising:
    a first power electrode contacting said second and third regions, and
    a second power electrode contacting aid second portion of said first region.

28. The semiconductor device of claim 26 further comprising:

a fourth region of said opposite type conductivity disposed adjacent said first region and spaced from said second region by said first region;

a first power electrode contacting said second and third regions; and a second power electrode contacting said fourth region.

29. The semiconductor device recited in claim 13 wherein:

the extension of said second and third regions under said first gate segments are self-aligned with respect to said first gate segments.

30. The semiconductor device recited in claim 17 wherein:

said second region is self-aligned with respect to both said first gate segments and said second gate segments; and the extensions of said third regions under said first gate segments are self-aligned with respect to said first gate segments.

31. The semiconductor field effect device recited in claim 23 wherein:

each of said second gate segments extends over said second region between the two of said first gate segments which it connects.

32. The semiconductor device recited in claim 26 wherein:

each of said second segments extends over said second region between the two of said first segments which it interconnects.

* * * * *